(12) United States Patent
Brandt et al.

(10) Patent No.: US 9,106,125 B1
(45) Date of Patent: Aug. 11, 2015

(54) AUGMENTED POWER CONVERTER

(75) Inventors: Randy L. Brandt, Orange, CA (US); James L. Peck, Jr., Huntington Beach, CA (US); Leora Peltz, Pasadena, CA (US)

(73) Assignee: The Boeing Company, Chicago, IL (US)

(*) Notice: Subject to any disclaimer, the term of this patent is extended or adjusted under 35 U.S.C. 154(b) by 1281 days.

(21) Appl. No.: 12/824,291

(22) Filed: Jun. 28, 2010

(51) Int. Cl.
*H02M 7/00* (2006.01)
*H03K 5/00* (2006.01)
*H02P 1/28* (2006.01)
*H02M 7/06* (2006.01)

(52) U.S. Cl.
CPC ........ *H02M 7/068* (2013.01); *H02P 1/28* (2013.01)

(58) Field of Classification Search
USPC .......................................... 318/400.2; 363/64
See application file for complete search history.

(56) References Cited

U.S. PATENT DOCUMENTS

| 5,534,831 | A | 7/1996 | Yabuki et al. |
| 5,534,837 | A | 7/1996 | Brandt |
| 5,668,707 | A * | 9/1997 | Barrett ............................ 363/44 |
| 7,342,477 | B2 | 3/2008 | Brandt et al. |
| 7,378,828 | B2 | 5/2008 | Brandt |
| 7,639,520 | B1 * | 12/2009 | Zansky et al. ................... 363/65 |
| 2006/0197480 | A1 * | 9/2006 | Mori et al. .................... 318/254 |
| 2008/0163475 | A1 * | 7/2008 | Snyder ........................ 29/602.1 |
| 2009/0244937 | A1 * | 10/2009 | Liu ................................. 363/46 |
| 2010/0134058 | A1 * | 6/2010 | Nagashima et al. ..... 318/400.23 |

\* cited by examiner

*Primary Examiner* — Eduardo Colon Santana
*Assistant Examiner* — Gabriel Agared
(74) *Attorney, Agent, or Firm* — Charles L. Moore; Moore & Van Allen PLLC

(57) ABSTRACT

An augmented power converter may include a motor drive circuit. The motor drive circuit may include a motor drive transformer to convert a two-phase DC voltage to a three-phase output voltage for operating an electrical device. The motor drive circuit may also include a power control component for each phase of the two-phase voltage.

22 Claims, 6 Drawing Sheets

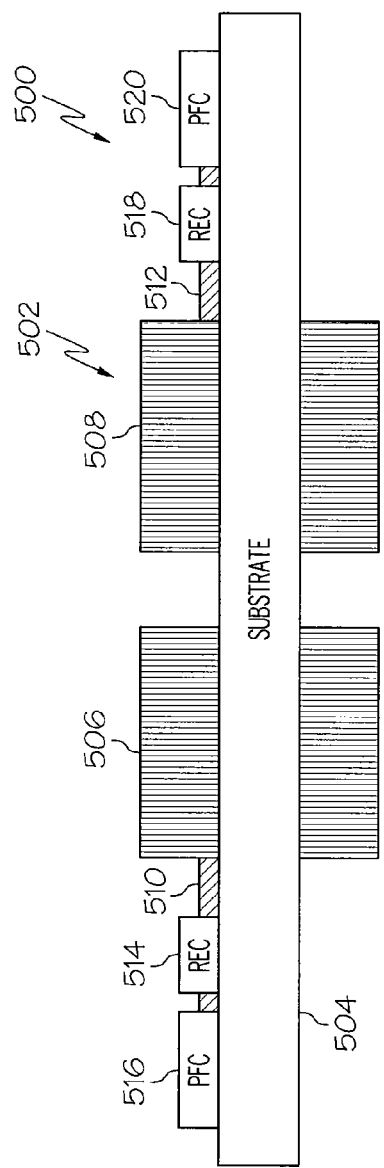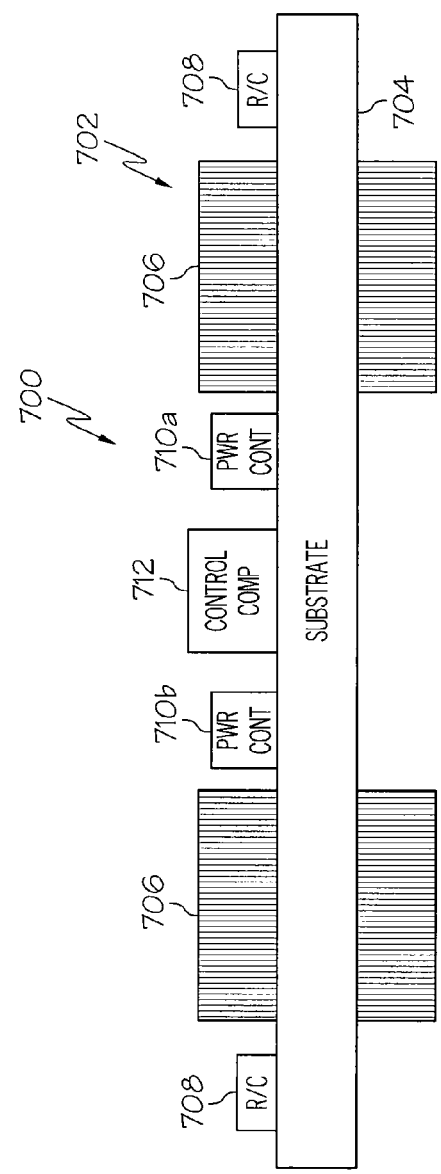

AUGMENTED POWER CONVERTER

FIELD

The present disclosure relates to power converters, motor drives and the like, and more particularly to an augmented power converter that may be used to drive an electric motor.

BACKGROUND

Aircraft use electromechanical actuators or electric motors coupled to a mechanical drive for operating flight control surfaces and other devices onboard the aircraft. Examples of the flight control surfaces that may be operated or moved by electromechanical actuators may include and is not necessarily limited to ailerons, flaps, elevator, rudder, speed brakes and the like. Power driver assemblies for such electromechanical actuators and other electrically powered devices can add significantly to the weight the aircraft and such assemblies can occupy a considerable amount of space within the aircraft structure. Every pound of onboard equipment can result in loss of fuel economy. Additionally the weight and volume of space taken by such equipment can reduce cargo and passenger capacity. Accordingly, any reduction in the weight and size of such actuators and other devices can result in more efficient operation of aircraft or other vehicles or equipment.

FIG. 1 is an example of a prior art power drive assembly 100 for a motor 102. The power drive assembly 100 may include a filter 104 for filter electrical power from a power source 106. The power source 106 may be a three-phase alternating current electrical power source or voltage source. The filter 104 may be an electromagnetic interference filter to substantially filter any extraneous electromagnetic energy that may be induced on the power feed 108 from the power source 106.

An alternating current-to-direct current (AC/DC) power converter 110 may receive the three-phase, filtered electrical power signal or electrical input voltage from the filter 104. The AC/DC power converter 110 may include a plurality of insulated gate bipolar transistors (IGBT) 112 or similar electronic switches to convert the alternating three-phase input voltage to a DC output voltage.

A DC link 114 may couple the AC/DC power converter 110 to a DC to Pulse Width Modulation (PWM) motor control 116. The DC to PWM motor control 116 may convert the DC voltage from the DC link 114 to a three-phase output voltage for driving the motor 102. The DC to PWM motor control 116 may also include a plurality of IGBTs 118.

Operation of the AC/DC power converter 110 and the DC to PWM 116 may be controlled by a computer 118. The computer 118 may be coupled to the AC/DC power converter 110 by suitable interfacing electronics 120 and the computer 118 may be coupled to the DC to PWM motor control 116 by interfacing electronics 122. The interfacing electronics 120 may condition the input signals from the computer 118 for use by the AC/DC power converter 110 and each of the IGBTs 112. The interfacing electronics 122 may condition the input signals from the computer 118 for use by the DC to PWM motor control 116.

The computer 118 may be coupled to the motor 102 by a link 124 to receive data or information related to operation of the motor 124 that may be used for controlling operation of the AC/DC power converter 110 and the DC to PWM motor control 116.

The computer 118 may also communicate with other systems 126, such as a flight management computer. Information and instructions may be received from these other systems 126 to control operation of the motor 102 and whatever actuator or other mechanism that may be driven by the motor 102. The computer 118 may also transmit data or information to the other system 126, such as information related to the status or condition of the motor 102 or whatever equipment or mechanism is operated by the motor 102.

SUMMARY

In accordance with an embodiment, an augmented power converter may include a motor drive circuit. The motor drive circuit may include a motor drive transformer to convert a two-phase DC voltage to a three-phase output voltage for operating an electrical device. The motor drive circuit may also include a power control component for each phase of the two-phase voltage.

In accordance with another embodiment, an augmented power converter may include an AC/DC power converter to convert a three-phase input voltage to a two-phase DC voltage. A DC link may be coupled to the AC/DC power converter. A motor drive circuit may be coupled to the DC link. The motor drive circuit may include a motor drive transformer to convert the two-phase voltage to a three-phase output voltage for operating an electric motor. A power control component may be provided for controlling activation of each phase of the two-phase voltage.

In accordance with another embodiment, a motor drive may include a motor drive transformer for converting a two-phase input voltage to a three-phase drive voltage for driving a three-phase electric motor. The motor drive may also include a controller for controlling switching of each phase of the two-phase input voltage. A power control transformer may be coupled to the controller. A first electronic switching device may be driven or controlled by a first phase output of the power control transformer for activation of a first phase of the two-phase input of the motor drive transformer. A second electronic switching device may be driven or controlled by a second phase output of the power control transformer for activation of a second phase of the two-phase input of the motor drive transformer. The first and second electronic switching devices may be alternately turned on and off to alternately activate the first and second phases of the motor drive transformer for commutating the electric motor.

In accordance with another embodiment, an AC/DC power converter may include a transformer for converting a three-phase input to a two-phase output. The power converter may also include a first power factor correction module to correct a power factor of a first phase of the two-phase output of the transformer. The power converter may additionally include a second power factor correction module to correct a power factor of a second phase of the two-phase output of the transformer.

In accordance with another embodiment, an electromagnetic interference (EMI) filter for filtering electrical power from a power source may include a flat-plate, copper plated ferrite substrate. At least one inductor may be formed on the substrate for each phase from the power source. A grounding circuit may couple each phase to ground.

In accordance with another embodiment, a method for driving an electric motor may include converting electrical power from a three-phase voltage source to a two-phase DC voltage. The method may also include linking the two-phase DC voltage to a motor drive circuit. The method may additionally include converting the two-phase DC voltage to a three-phase voltage for driving a three-phase electric motor. The method may further include controlling activation of each phase of the two-phase DC voltage for commutation of the three-phase voltage driving the electric motor.

Other aspects and features of the present disclosure, as defined solely by the claims, will become apparent to those ordinarily skilled in the art upon review of the following non-limited detailed description of the disclosure in conjunction with the accompanying figures.

BRIEF DESCRIPTION OF THE SEVERAL VIEWS OF THE DRAWINGS

The following detailed description of embodiments refers to the accompanying drawings, which illustrate specific embodiments of the disclosure. Other embodiments having different structures and operations do not depart from the scope of the present disclosure.

FIG. 5 is a side elevation view of an example of an AC/DC power converter in accordance with an embodiment of the present disclosure.

FIG. 7 is a side elevation view of an example of a motor drive in accordance with an embodiment of the present disclosure.

DESCRIPTION

The following detailed description of embodiments refers to the accompanying drawings, which illustrate specific embodiments of the disclosure. Other embodiments having different structures and operations do not depart from the scope of the present disclosure.

Figure 2:
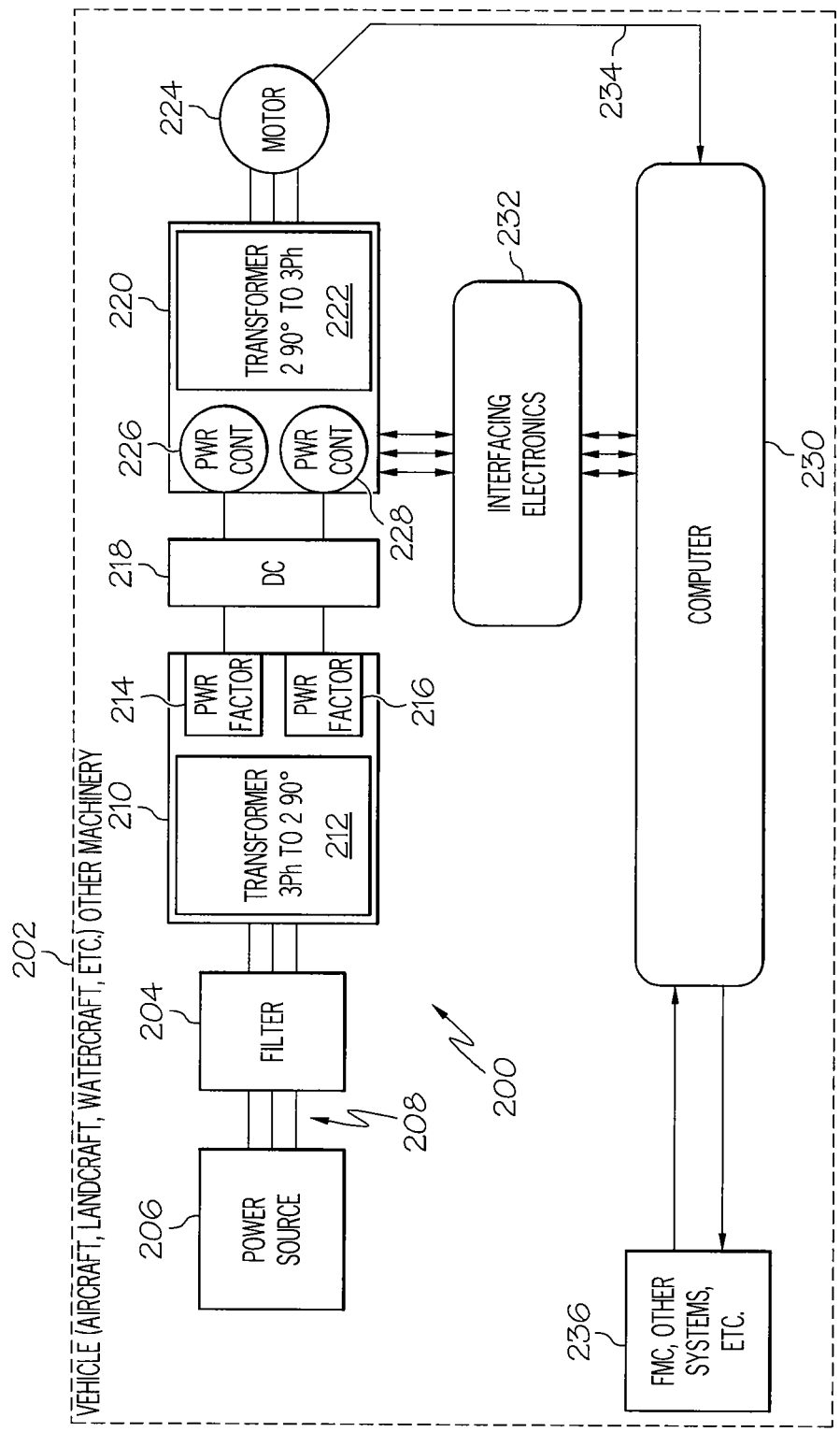
FIG. 2 is an exemplary augmented power converter in accordance with an embodiment of the present disclosure.

FIG. 2 is an exemplary augmented power converter 200 in accordance with an embodiment of the present disclosure. The augmented power converter 200 may be operable on a vehicle 202, such as an aircraft, land craft or terrestrial vehicle, watercraft, or other machinery.

The augmented power converter 200 may include a filter 204. The filter 204 may be adapted to receive three-phase input electrical power or a three-phase input voltage from a power source 206. The filter 204 may be an electromagnetic interference (EMI) filter to filter any electromagnetic energy that may be in the power signal from the power source 206 or any electromagnetic energy or electromagnetic signals that may be induced on a three-phase power feed 208 from the power source 206. An example of an EMI filter that may be used for EMI filter 204 will be described in more detail with reference to FIG. 3.

An AC/DC power converter 210 may receive the three-phase input voltage or power from the EMI filter 204. The AC/DC power converter 210 may include a transformer 212 having a configuration to convert the three-phase input voltage or power to a two-phase DC voltage or power. The transformer 212 may include a configuration to convert the three-phase voltage to the two-phase output voltage having a zero degree (0°) phase output and a ninety degree (90°) phase output. Each output phase may include a power correction module 214 and 216 respectively. An example of an AC/DC power converter that may be used for the AC/DC power converter 210 will be described in more detail with reference to FIG. 3.

A DC link 218 may connect the AC/DC power converter 210 to a motor drive circuit 220. The motor drive circuit 220 may include a motor drive transformer 222. The motor drive transformer may include a configuration to convert the two-phase DC voltage or power from the DC link 218 to a three-phase voltage or power for operating an electrical device or motor 224. A power control component 226 and 228 may be included to control the power on each phase of the two-phase voltage received by the motor drive circuit 220. The power control components 226 and 228 may be controlled by on and off timing command signals, as described herein, to provide commutation of the three-phase output power from the motor drive circuit 220 to cause the motor 224 to run or operate. An active control component or processor may provide the on and off timing command signals to each power control component 226 and 228. An example of a motor drive circuit that may be used for the motor drive circuit 220 will be described in more detail with reference to FIG. 6.

The augmented power converter 200 may also include a computer 230 for controlling operation of the motor drive circuit 220. The computer 230 may be coupled to the motor drive circuit by suitable interfacing electronics 232. The interfacing electronics 232 may be adapted to condition or format the control signals from the computer 230 for use by the motor drive circuit 220. The computer 230 may control operation of the power control components 226 and 228 for providing the proper three-phase output voltage for running the motor 224.

The computer 230 may receive data or information from the motor 224 via a feedback link 234. The data or information may be used by the computer 230 to provide the proper timing and other signals to the motor drive circuit 220 to control operation of the motor 224.

The computer 230 may also receive data or information from other systems or sources 236. For example, the other systems or sources 236 may include a flight management computer (FMC), sensors or the like. The sensors may provide information or data such as an amount of current being supplied to the motor 224, a torque of the motor 224, a velocity of the motor 224, a position of the motor 224 or any other information that may be of benefit or useful in controlling operation of the motor 224.

Figure 1:
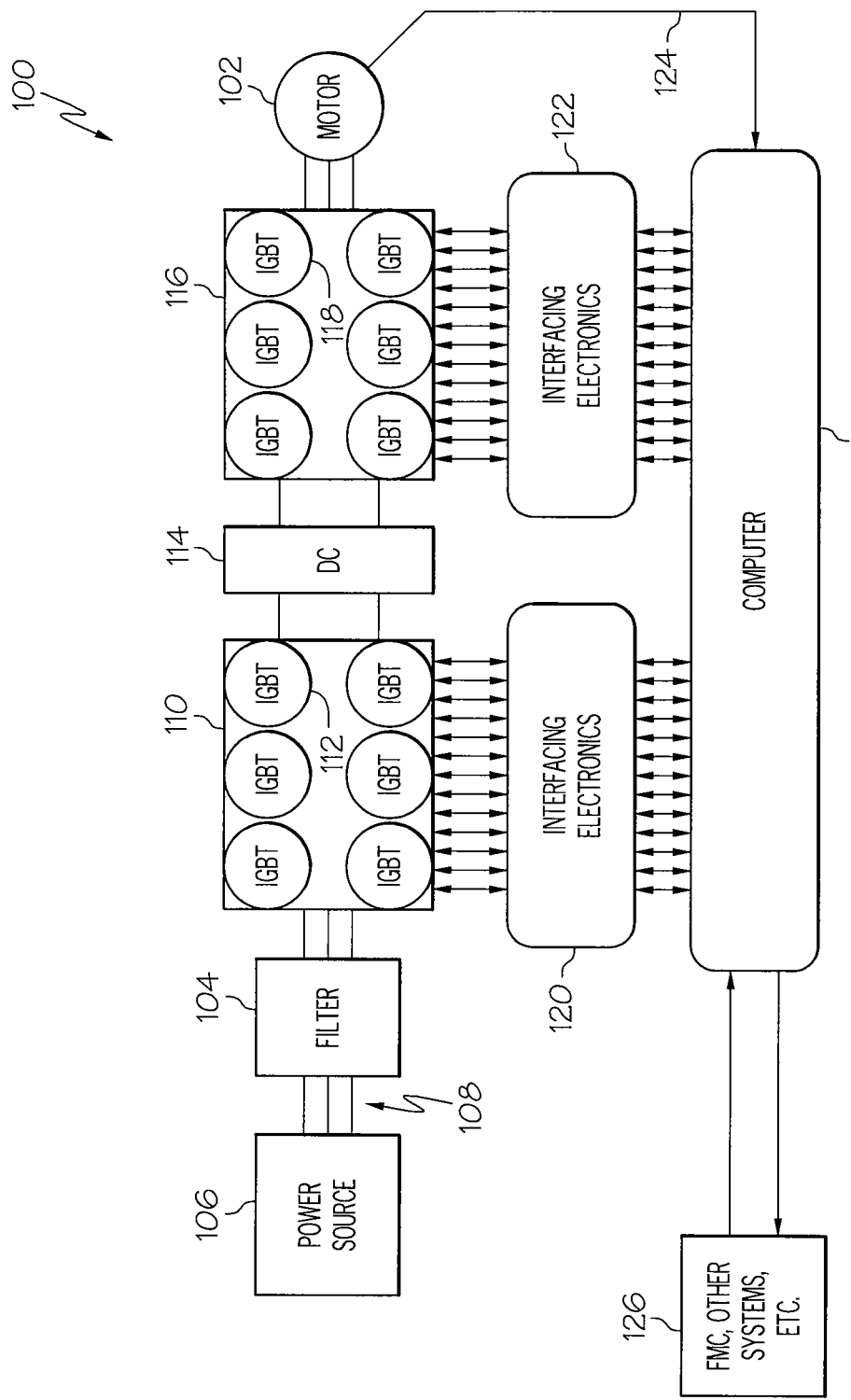
FIG. 1 is an example of a prior power drive assembly for a motor.

Comparing the augmented power converter 200 with the prior art power drive assembly 100 of FIG. 1, the augmented power converter 200 eliminates the multiple IGBTs 112 and 118 in both the AC/DC power converter 110 and the motor control or motor drive circuit 116. Additionally, the augmented power converter eliminates the need for computer control of both the AC/DC power converter 110 and the motor control or motor drive circuit 116. Only the motor drive circuit 220 receives control or input from the computer 230 in the augmented power converter 200. Accordingly, the augmented power converter 200 described herein is much simpler than the prior art power drive assembly 100, occupies less space, and has reduced weight for more efficient use of vehicles such as aircraft or the like.

Figure 3:
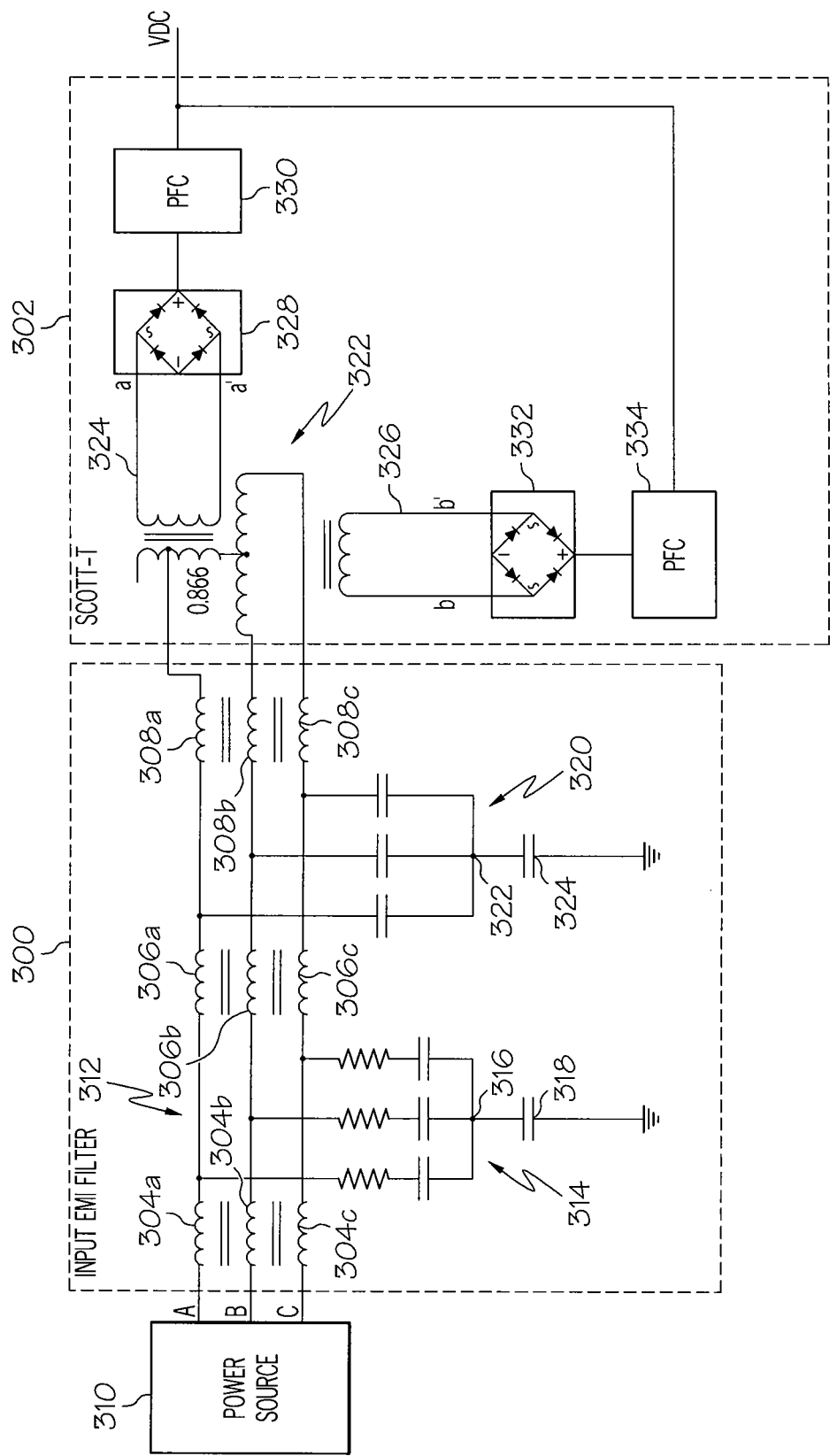
FIG. 3 is a schematic diagram of an example of an electromagnetic interference filter and alternating current to direct current (AC/DC) power converter in accordance with an embodiment of the present disclosure.

FIG. 3 is a schematic diagram of an example of an electromagnetic interference (EMI) filter 300 and alternating current to direct current (AC/DC) power converter 302 in accordance with an embodiment of the present disclosure. The EMI filter 300 may be used for the filter 204 in FIG. 2 and the AC/DC power converter 302 may be used for the AC/DC power converter 210 in FIG. 2. While the EMI filter 300 is illustrated as being electrically connected to the AC/DC power converter 302 in the example of FIG. 3, these components to not necessarily need to be used together and may have other applications or may be used in other types of systems.

The EMI filter 300 may include at least one inductor 304a, 304b and 304c connected between a power source 310 and the AC/DC power converter 302 in each phase of the three-phase power feed 312 from the power source 310. A resistor and capacitor circuit 314 may connect each phase of the three-phase power feed 312 to ground potential. The resistor and capacitor circuit 314 may include a series connected resistor and capacitor connected between each phase and a common point or connection 316. A capacitor 318 may then connect the common point 316 to ground potential.

In the exemplary EMI filter 300 illustrated in FIG. 3, a first inductor 304a, 304b, 304c in each phase (a, b, c) of the three-phase power feed 312, a second inductor 306a, 306b, 306c in each phase and a third inductor 308a, 308b, 308c in each phase may be connected in series between the power source 310 and the AC/DC power converter 302. The resistor and capacitor circuit 314 or first resistor and capacitor circuit 314 may include a series connected resistor and capacitor connected to each phase of the three-phase power feed 312 between the first inductor 304a, 304b, 304c in each phase and the second inductor 306a, 306b and 306c in each phase. A second series connected resistor and capacitor circuit 320 may include a series connected resistor and capacitor connected to each phase of the three-phase power feed 312 between the second inductor 306a, 306b and 306c in each phase and the third inductor 308a, 308b, and 308c in each phase. Each of the series connected resistor and capacitor circuits of the first circuit 314 are connected respectively between each phase (a, b, c) and the common point 316. Each series connected resistor and capacitor circuit in the second circuit 320 are connected respectively between each phase (a, b, c) and a common point 322. The common point 316 may be connected to ground potential by the capacitor 318. The common point 322 may be connected to ground potential by the second capacitor 324. The EMI filter 300 may include any combination of resistor and capacitor configurations similar to those illustrated in FIG. 3.

Figure 4:
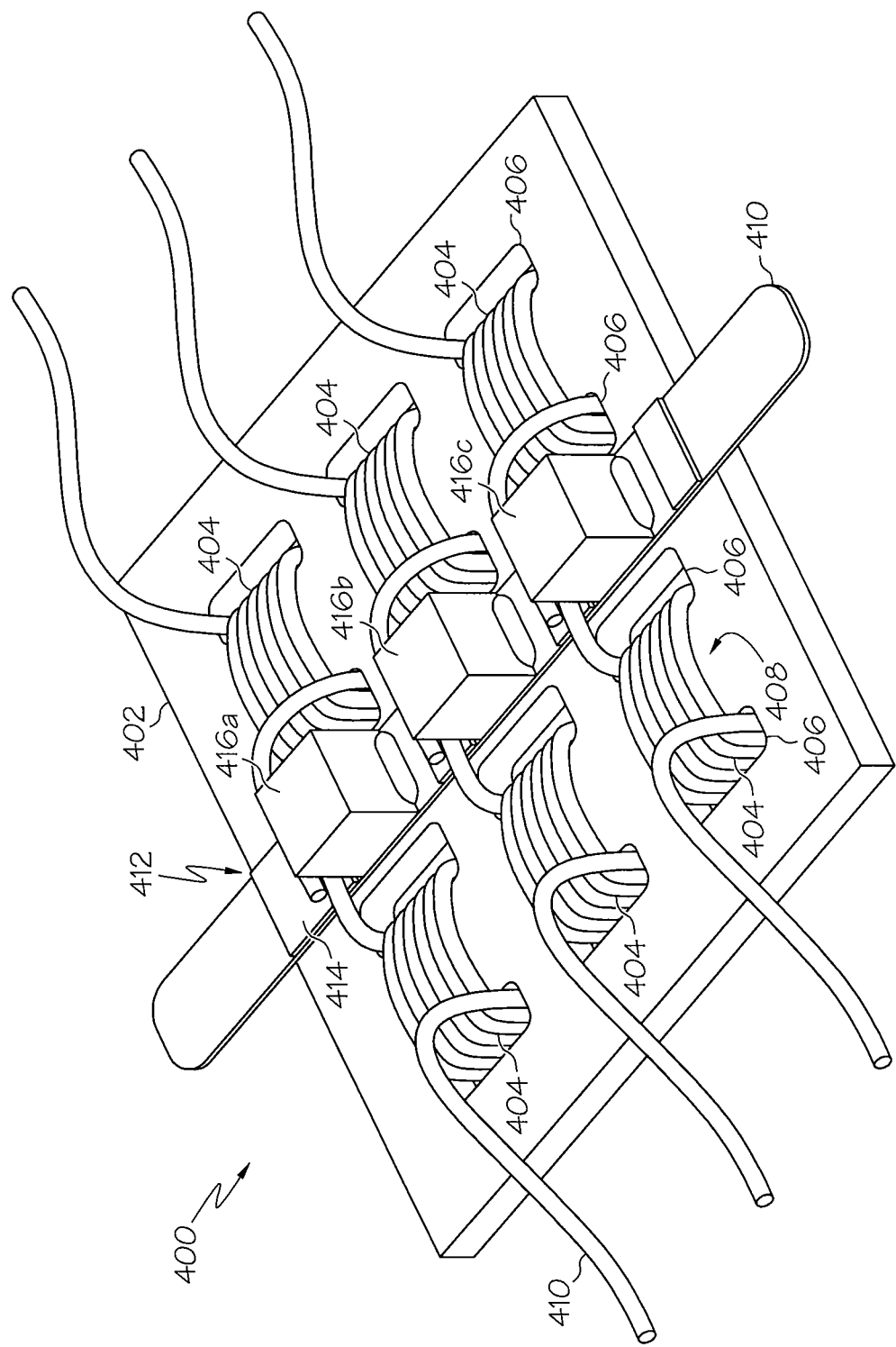
FIG. 4 is a perspective view of an example of an electromagnetic interference filter in accordance with an embodiment of the present disclosure.

Referring also to FIG. 4, FIG. 4 is a perspective view of an example of an EMI filter 400 in accordance with an embodiment of the present disclosure. The EMI filter 300 of FIG. 3 may be embodied in the EMI filter 400 of FIG. 4. The EMI filter 400 may include a flat-plate, copper plated ferrite substrate 402. The plate or substrate 402 may be an insulated manganese zinc (MnZn) ferrite plate. A plurality of inductors 404 are formed on the substrate 402. Longitudinal slots 406 may be formed in the substrate 402 to form a land or region 408 between respective pairs of slots 406. Each of the plurality of inductors 404 may then be formed by winding electrical wire around each of the lands or regions 408 between the respective pairs of the longitudinal slots 406. The electrical wire used to form each of the inductors 404 may be Litz wire or the like The inductors 404 may be formed to provide a predetermined low profile of between about 0.040 inches and about 0.10 inches in height.

As illustrated in FIG. 4, the inductors 404 may be formed in three rows of two series connected inductors 404. Each row may be connected in series in each phase of the three-phase power feed similar to that illustrated in FIG. 3.

A conductive ground strap 410 may be disposed down a center portion 412 of the substrate 402 between each pair of series connected inductors 404. Connection wires from adjacent series connected inductors 404 for each phase of the three-phase power feed may be joined or electrically connected together on a polyimide insulator 414 or other insulation material formed on the conductive ground strap 410 to insulate the connection wires from the ground strap 410.

Three surface mounted film capacitors 416a, 416b and 416c may be mounted on the ground strap 410. Each capacitor 416a, 416b and 416c may be connected to each phase of the three-phase power at a point between the series connected inductors 404 similar to that illustrated in FIG. 3. Each capacitor 416a, 416b and 416c may then connect each phase to the ground strap 410.

Each film capacitor 416a, 416b and 416c or resistor and capacitor circuit 314 and 320 in FIG. 3 has a predetermined height or profile so that the EMI filter 300 or 400 has a height of less than about 0.3 inches. The substrate 402 of the EMI filter 400 may have a footprint of about 2 inches by about 2 inches to substantially minimize space occupied by the EMI filter 300 or 400 and the weight of the filter 300 or 400.

Referring back to FIG. 3, the AC/DC power converter 302 may include a transformer 322 to receive the three-phase power or voltage from the EMI filter 300. The transformer 322 may be a Scott-T transformer or similar transformer capable of converting the three-phase input voltage to a two-phase output DC voltage. Accordingly, the transformer 322 or Scott-T transformer may include a 0° phase output 324 and a 90° phase output 326. A first rectifier switch 328 or switching drive may be coupled to the 0° phase output 324 of the transformer 322. A first power factor correction module 330 may be coupled to the first rectifier switch 328. A second rectifier switch 332 or switching device may be coupled to the 90° output 326 of the transformer 322. A second power factor correction module 334 may be coupled to the second rectifier switch 332. The output of the first power factor correction module 330 and the second power factor correction module 334 provide a two-phase DC output voltage (VDC).

FIG. 5 is a side elevation view of an example of an AC/DC power converter 500 in accordance with an embodiment of the present disclosure. The AC/DC power converter 302 and FIG. 3 may be embodied in the AC/DC power converter 500 illustrated in FIG. 5. The AC/DC power converter 500 may include a transformer 502. The transformer 502 may be a Scott-T transformer similar to the Scott-T transformer 324 and FIG. 3. The transformer 502 may include a copper plated nickel-iron substrate 504. The substrate 504 may be formed in a flat plate having a width of between about 0.10 inches and about 0.20 inches. The transformer 502 may also be formed by two flat-plate ferrite inductors 506 and 508 which each have a predetermined low profile. For example, the each of the flat-plate ferrite inductors 506 and 508 may have dimensions of about 1"×2"×0.1".

The transformer 502 may include a first output or 0° output 510 and a second output or 90° output 512 similar to the exemplary transformer 324 in FIG. 3. Similar to that described with respect to FIG. 3, the first or 0° output 510 of the transformer 502 may be connected to a first rectifier switch 514 and the first rectifier switch 514 may be connected to a first power factor correction module 516. The second or 90° output 512 of the transformer 502 may be connected to a second rectifier switch 518. The second rectifier switch 518 may be connected to a second power factor correction module 520. These components of the AC/DC power converter 500 may be surface mounted passive components as illustrated in FIG. 5. The components may have a predetermined profile or size to substantially minimize the amount of space occupied by the converter 500 and to reduce the weight of the converter 500.

Figure 6:
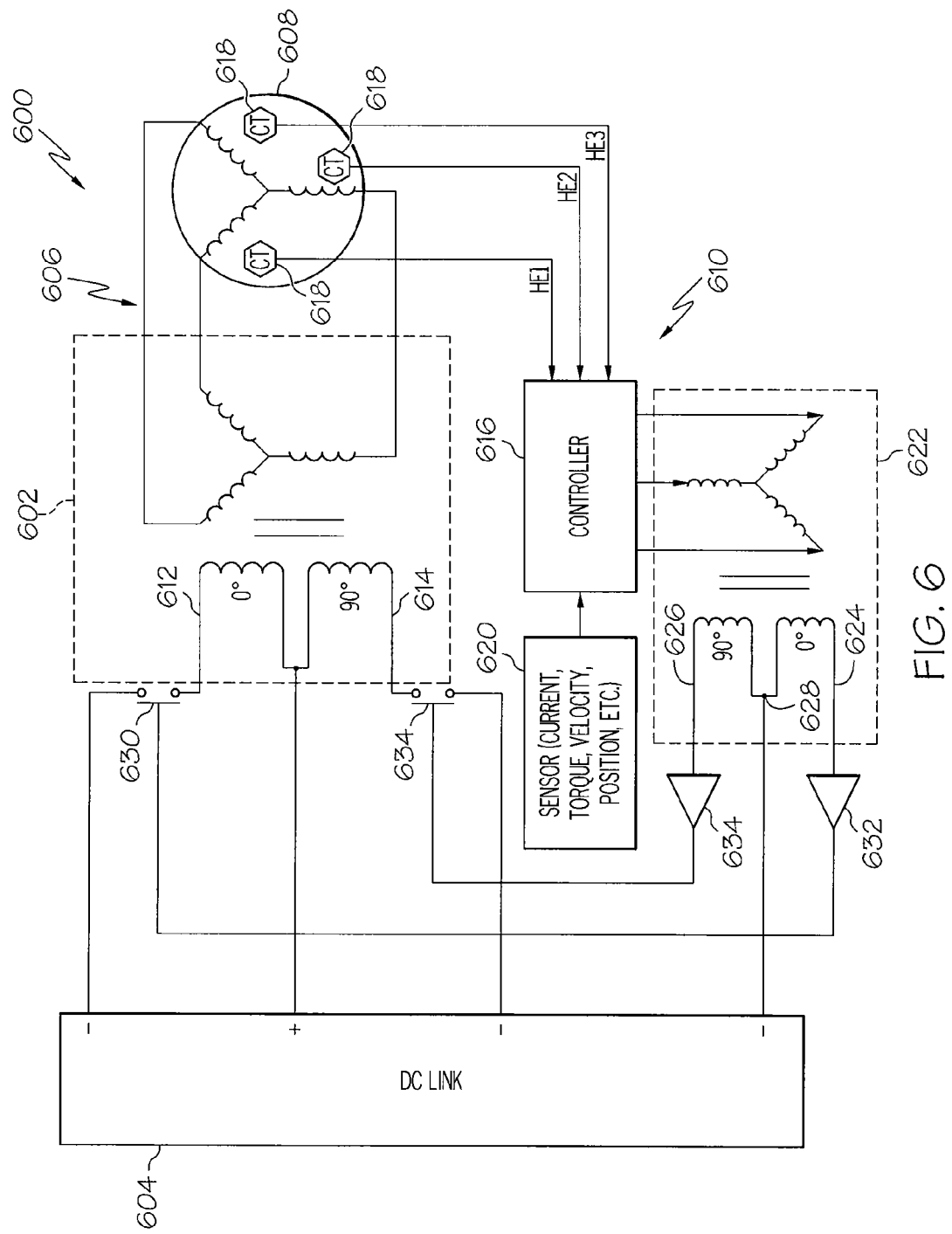
FIG. 6 is a schematic diagram of an example of a motor drive circuit in accordance with an embodiment of the present disclosure.

FIG. 6 is a schematic diagram of an example of a motor drive circuit 600 in accordance with an embodiment of the present disclosure. The motor drive circuit 600 may include a motor drive transformer 602 to convert a two-phase DC voltage from a DC link 604 to a three-phase output voltage for operating or driving an electrical device, such as electric motor 608. The motor drive transformer 602 may be a Scott-T transformer or the like including a 0° phase input 612 and a 90° phase input 614 for receiving the DC voltage from the DC link 604. The motor drive circuit 600 may also include a power control component 610 for controlling each phase of the two-phase voltage received by the motor drive circuit 600.

The power control component 610 of the motor drive circuit 600 may include a controller 616 to receive signals from sensors 618 associated with the electric motor 608 for generating commutating signals as described herein for operation of the electric motor 608. The sensors 618 may be Hall Effect sensors to sense or detect current flow in each of the three-phase windings of the electric motor 608 to control the generation and supplying of the commutating signals or voltage to the electric motor 608.

The controller 616 may be a microcontroller, such as a Texas Instruments UC2625 microcontroller or similar microcontroller. The controller 616 may also receive control signals from other sources or sensors 620 for sensing different operating parameters that may be associated with the motor 608. The other sources or sensors 620 may provide data or information, such as electrical current being drawn by the electric motor 608, a torque being generated by the electric motor 608, a position of an output shaft of the electric motor 608, a velocity or revolutions per minute (RPM) of the motor 608 or other parameters that may be helpful in controlling operation of the motor 608 to perform a particular purpose or function, such as operation of an actuator on a aircraft, operation of a movable component on another vehicle or machinery.

The power control component 610 may also include a power control transformer 622. The power control transformer 622 may also be a Scott-T transformer including a first phase output or 0° phase output 624 and a second phase output or 90° phase output. The Scott-T transformer 622 may include a center tap 628 coupled to a negative terminal of the DC link 604.

A first control switch 630 may be controlled or driven by the first or 0° phase output 624 of the power control transformer 622. The first control switch 630 controls activation of a first phase or 0° phase input 612 of the motor drive transformer 602 for providing commutation. The first control switch 630 is activated or closed in response to a signal from the first or 0° phase output 624 of the motor control transformer 622. The first or 0° input phase 612 of the motor drive transformer 602 is energized in response to the first control switch 630 being closed. The three-phase output of the motor drive transformer 602 then provides commutation energy for operation of the motor 608. The first or 0° phase output 624 of the power control transformer 622 may be coupled to the first control switch 630 by a transformer 632.

Similarly, a second control switch 634 may be controlled or driven by the second or 90° phase output 626 of the power control transformer 622. The second control switch 634 controls activation of the second phase or 90° input phase 614 of the motor drive transformer 602 for providing commutation of the motor 608. The second control switch 634 is activated or closed in response to a signal from the second or 90° phase output 626 of the power control transformer 622. The second or 90° input phase 614 of the motor drive transformer 602 is energized in response to the second control switch 634 being closed. The three-phase output of the motor drive transformer 602 then provides commutation energy for operation of the motor 608. The second or 90° phase output 626 of the power control transformer 622 may be coupled to the second control switch 634 by an amplifier 634. The first and second control switches 630 and 634 may an electronic switching device, such as a field effect transistor, IGBT or other type device capable of performing the functions described herein.

In operation of the power control component 610, on and off timing of operation or opening and closure of the first and second control switches 630 and 634 may be controlled by the controller 616 through the power control transformer 622 to provide commutation of the motor 608. The first and second or 0° and 90° input phases 612 and 614 are alternately energized by the opening and closing of the switches 630 and 634 in response to the on/off timing from the controller 616 to control operation of the motor 608.

FIG. 7 is a side elevation view of an example of a motor drive 700 in accordance with an embodiment of the present disclosure. The exemplary motor drive circuit 600 in FIG. 6 may be embodied in the motor drive 700. The motor drive circuit 700 may include a motor drive transformer 702. The motor drive transformer 702 may be similar to the motor drive transformer 602 of FIG. 6 and may be adapted to convert a two-phase DC voltage to a three-phase output voltage for operating an electrical device, such as motor 608 in FIG. 6.

The motor drive transformer 702 may include a copper plated ferrite substrate 704. A plurality of inductors 706 may be formed on the copper plated ferrite substrate 704 to form the transformer 702. The copper plated ferrite substrate 704 may be a substantially flat plate as illustrated and FIG. 7.

The motor drive 700 may also include a plurality of resistors and capacitors 708 coupled to the inductors 706. The resistors and capacitors 708 may have a predetermined profile to substantially minimize size and weight of the motor drive circuit 700.

Similar to that previously described, the motor drive circuit 700 may also include a power control component 710a and 710b to control each phase of the two-phase voltage received by the motor drive circuit 700. The power control components 710a and 710b may include electronic switching devices similar to switches 630 and 634 driven by the outputs of power control transformer 622 as described with reference to FIG. 6.

An active control component 712 may he provided to control operation of the motor drive circuit 700. The active control component 712 may be similar to the controller 616 in FIG. 6. The active control component 712 may include a local processor to provide on and off timing command signals to each power control component 710a and 710b.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the embodiments herein have other applications in other environments. This application is intended to cover any adaptations or variations of the present disclosure.

The following claims are in no way intended to limit the scope of the disclosure to the specific embodiments described herein.

What is claimed is:

1. An augmented power converter, comprising:
   a motor drive circuit;
   an AC/DC power converter to convert a three-phase input voltage to the two-phase DC voltage supplied to the motor drive circuit, wherein the AC/DC power converter comprises:
      a transformer comprising a substrate, wherein the substrate is formed in a flat plate and wherein the transformer includes a first output and a second output;
      a power factor correction module coupled to each output of the transformer; and
      a flat-plate inductor associated with each output of the transformer;
   wherein the motor drive circuit comprises:
      a motor drive transformer to convert a two-phase DC voltage to a three-phase output voltage for operating an electrical device;
      a power control component for each phase of the two-phase voltage; and
      an active control component that provides timing command signals to each power control component for commutation of the three-phase output voltage.

2. The augmented power converter of claim 1, wherein the motor drive transformer comprises:
   a copper plated ferrite substrate; and
   a plurality of inductors formed on the copper plated ferrite substrate to form the transformer.

3. The augmented power converter of claim 2, wherein the copper plated ferrite substrate comprises a flat plate.

4. The augmented power converter of claim 3, wherein the motor drive circuit further comprises:
   a plurality of resistors and capacitors coupled to the inductors, wherein each of the plurality of resistors and capacitors have a predetermined profile to substantially minimize size and weight of the motor drive circuit.

5. The augmented power converter of claim 4, wherein the active control component comprises a local processor to provide on and off timing command signals to each power control component.

6. The augmented power converter of claim 1, wherein the transformer of the AC/DC power comprises a Scott-T transformer including a 0° output and a 90° output and wherein the AC/DC power converter further comprises:
   a Scott-T transformer including a 0° output and a 90° output;
   a first rectifier switch coupled to the 0° output;
   a second rectifier switch coupled to the 90° output;
   a first power factor correction module coupled to the first rectifier switch; and
   a second power factor correction module coupled to the second rectifier switch.

7. The augmented power converter of claim 1, further comprising a DC link connecting the AC/DC power converter to the motor drive circuit.

8. The augmented power converter of claim 7, further comprising an EMI filter to couple a power source to the AC/DC power converter.

9. The augmented power converter of claim 8, wherein the EMI filter comprises:
   a substrate; and
   a plurality of flat-plate inductors formed on the substrate, wherein the power source is a three-phase power source, at least one inductor connected in series between the power source and the AC/DC power converter in each phase from the power source.

10. The augmented power converter of claim 8, wherein the EMI filter comprises:
    a flat-plate, copper plated ferrite substrate;
    a plurality of inductors formed on the substrate, wherein the power source is a three-phase power source, at least one inductor connected in series between the power source and the AC/DC power converter in each phase from the power source; and
    a resistor and capacitor circuit connecting each phase to ground.

11. The augmented power converter of claim 8, wherein the power source supplies three-phase power to the EMI filter and wherein the EMI filter comprises:
    a first inductor, a second inductor and a third inductor connected in series between the power source and the AC/DC power converter in each phase of the three-phase power supplied from the power source;
    a series connected resistor and capacitor circuit connected to each phase of the three-phase power between the first and the second inductor and between the second inductor and the third inductor, wherein the series connected resistor and capacitor circuits between the first and the second inductors are connected respectively between each phase and a first common point and the series connected resistor and capacitor circuits between the second and third inductors are connected respectively between each phase and a second common point;
    a first capacitor to connect the first common point to ground potential; and
    a second capacitor to connect the second common point to ground potential.

12. The augmented power converter of claim 11, wherein the each resistor and capacitor circuit has a predetermined height so that the EMI filter has a height less than about 0.3 inches.

13. The augmented power converter of claim 8, wherein the EMI filter has a footprint of about 2 inches by about 2 inches.

14. The augmented power converter of claim 1, wherein the electrical device is an electromechanical actuator for operating a flight control mechanism on an aircraft.

15. The augmented power converter of claim 1, wherein the electrical device comprises an electric motor and wherein the motor drive circuit further comprises:
    a microcontroller to receive signals from sensors associated with the electric motor for generating commutating signals for the electric motor;
    a power control transformer coupled to the microcontroller, the power control transformer having a first phase output and a second phase output;
    a first switch being driven by the first phase output of the power control transformer and wherein the first switch controls activation of a first phase of the motor drive transformer; and
    a second switch being driven by the second phase output of the power control transformer, wherein the second switch controls activation of a second phase of the motor drive transformer, wherein the first and second switches are alternately turned on and off by the microcontroller to alternately activate the first and second phases of the motor drive transformer for commutating the electric motor.

16. An augmented power converter, comprising:
- an AC/DC power converter to convert a three-phase input voltage to a two-phase DC voltage, wherein the AC/DC power converter comprises:
  - a transformer comprising a substrate, wherein the substrate is formed in a flat plate and wherein the transformer comprises a first output, a second output and an inductor associated with each output; and
  - a power factor correction module coupled to each output of the transformer;
- a DC link coupled to the AC-DC converter; and
- a motor drive circuit coupled to the DC link, the motor drive circuit comprising:
  - a motor drive transformer to convert the two-phase voltage to a three-phase output voltage for operating an electric motor;
  - a power control component for controlling activation of each phase of the two-phase voltage; and
  - a controller that provides timing command signals to the power control component for commutation of the three-phase output voltage.

17. The augmented power converter of claim 16, wherein the motor drive circuit transformer comprises:
- a flat-plate, copper plated ferrite substrate; and
- a plurality of inductors formed on the flat-plate copper plated ferrite substrate to form the transformer, and wherein the motor drive circuit further comprises:
- a plurality of resistors and capacitors coupled to the inductors, wherein each of the plurality of resistors and capacitors have a predetermined profile to substantially minimize size and weight of the motor drive circuit; and
- an active control component to control operation of the motor drive circuit.

18. The augmented power converter of claim 16, further comprising an EMI filter to couple a power source to the AC/DC power converter.

19. The augmented power converter of claim 18, wherein the EMI filter comprises:
- a flat-plate, copper plated ferrite substrate;
- a plurality of inductors formed on the substrate, wherein the power source is a three-phase power source, at least one inductor connected in series between the power source and the AC/DC power converter in each phase from the power source; and
- a resistor and capacitor circuit connecting each phase to ground.

20. The augmented power converter of claim 16, wherein the motor drive circuit further comprises:
- a three-phase to two-phase power control transformer coupled to the controller;
- a first switch being driven by a first phase output of the power control transformer and wherein the first switch controls activation of a first phase of the motor drive transformer; and
- a second switch being driven by a second phase output of the power control transformer, wherein the second switch controls activation of a second phase of the motor drive transformer, wherein the first and second switches are alternately turned on and off by the controller to alternately activate the first and second phases of the motor drive transformer for commutating the electric motor.

21. An AC/DC power converter, comprising:
- a transformer for converting a three-phase input to a two-phase output, wherein the transformer comprises:
  - a substrate formed in a flat plate; and
  - an inductor formed on the substrate, wherein the transformer for converting the three-phase input to the two-phase output comprises a Scott-T transformer, the two-phase output of the Scott-T transformer including a 0° phase and a 90° phase;
- a first power factor correction module at a first phase output of the transformer to correct a power factor of the first phase of the two-phase output of the transformer; and
- a second power factor correction module at a second phase output of the transformer to correct a power factor of the second phase of the two-phase output of the transformer.

22. The AC/DC power converter of claim 21, further comprising:
- a first rectifier switch to couple the first power factor correction module to the first phase output of the transformer, wherein the first rectifier switch is directly connected to the first power factor correction module; and
- a second rectifier switch to couple to the second power factor correction module to the second phase output of the transformer, wherein the second rectifier switch is directly connected to the second power factor module.

\* \* \* \* \*